United States Patent [19]

Domingo

[11] Patent Number: 4,479,201
[45] Date of Patent: Oct. 23, 1984

[54] SERPENTINE CHARGE COUPLED DEVICE

[75] Inventor: George Domingo, Hawthorne, Calif.

[73] Assignee: Hughes Aircraft Company, El Segundo, Calif.

[21] Appl. No.: 331,504

[22] Filed: Dec. 17, 1981

[51] Int. Cl.³ .............................................. G11C 13/04
[52] U.S. Cl. .................................... 365/183; 357/24; 377/63
[58] Field of Search ...................... 377/57, 61, 62, 63; 357/24 R; 365/182, 183; 333/165

[56] References Cited

U.S. PATENT DOCUMENTS

| 3,965,462 | 6/1976 | Belt | 365/183 |
| 4,371,885 | 1/1983 | Parrish et al. | 357/24 |
| 4,380,056 | 4/1983 | Parrish et al. | 365/183 |

Primary Examiner—Joseph A. Popek
Attorney, Agent, or Firm—Lewis B. Sternfels; W. J. Bethurum; A. W. Karambelas

[57] ABSTRACT

Trade-off between dynamic range and sampling rate in a charge coupled device is virtually eliminated in the serpentine charge coupled device of the present invention. In this device, for each charge packet transferred in a first direction, a plurality of n charge packets are transferred in a second transverse direction in the serpentine register. Accordingly, for a given charge transfer rate in the first direction, the charge coupled device clock frequency is increased by a factor of n. The serpentine register is formed on the semiconductive substrate having two parallel channel stops extending in a first direction and a plurality of parallel interlaced channel stop fingers extending in a second direction which are alternately connected to the two parallel channel stops. Charge transfer is accomplished under the control of a plurality of n parallel electrodes extending in a first direction formed in a first level above the substrate and a second plurality of parallel electrodes formed in a second level above the substrate which extend diagonally in a third direction. A complementary pair of clock signals are alternately connected among the first electrodes and among the diagonal electrodes.

12 Claims, 9 Drawing Figures

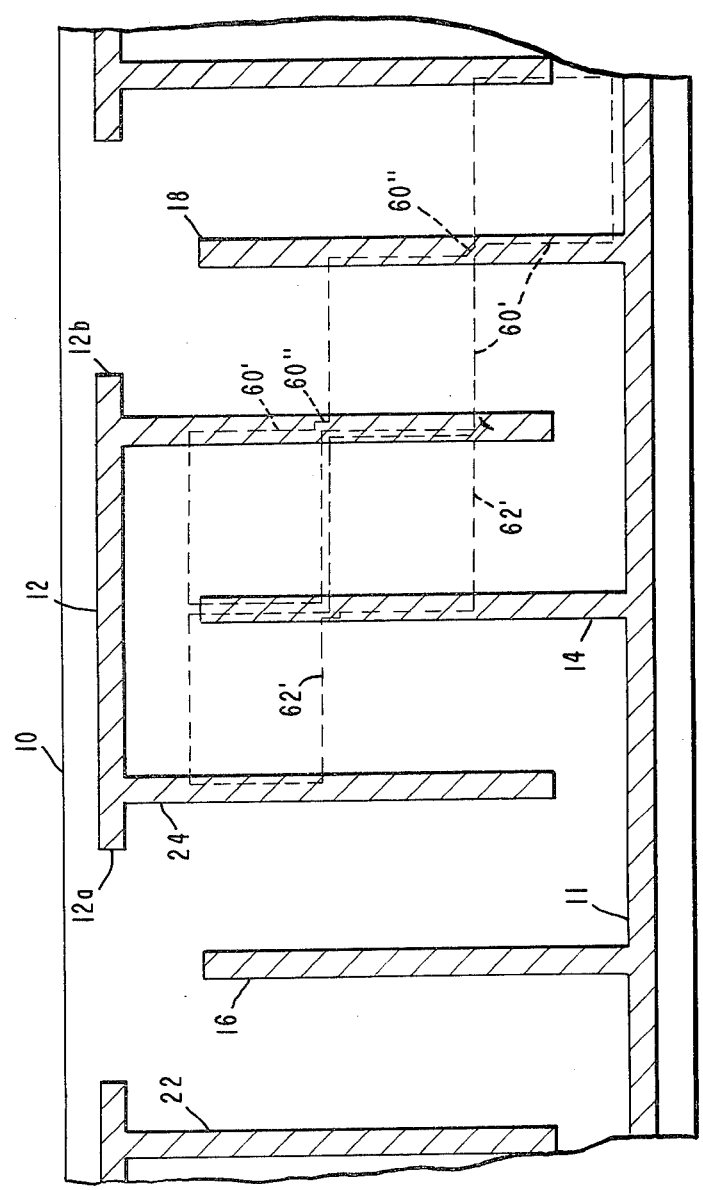

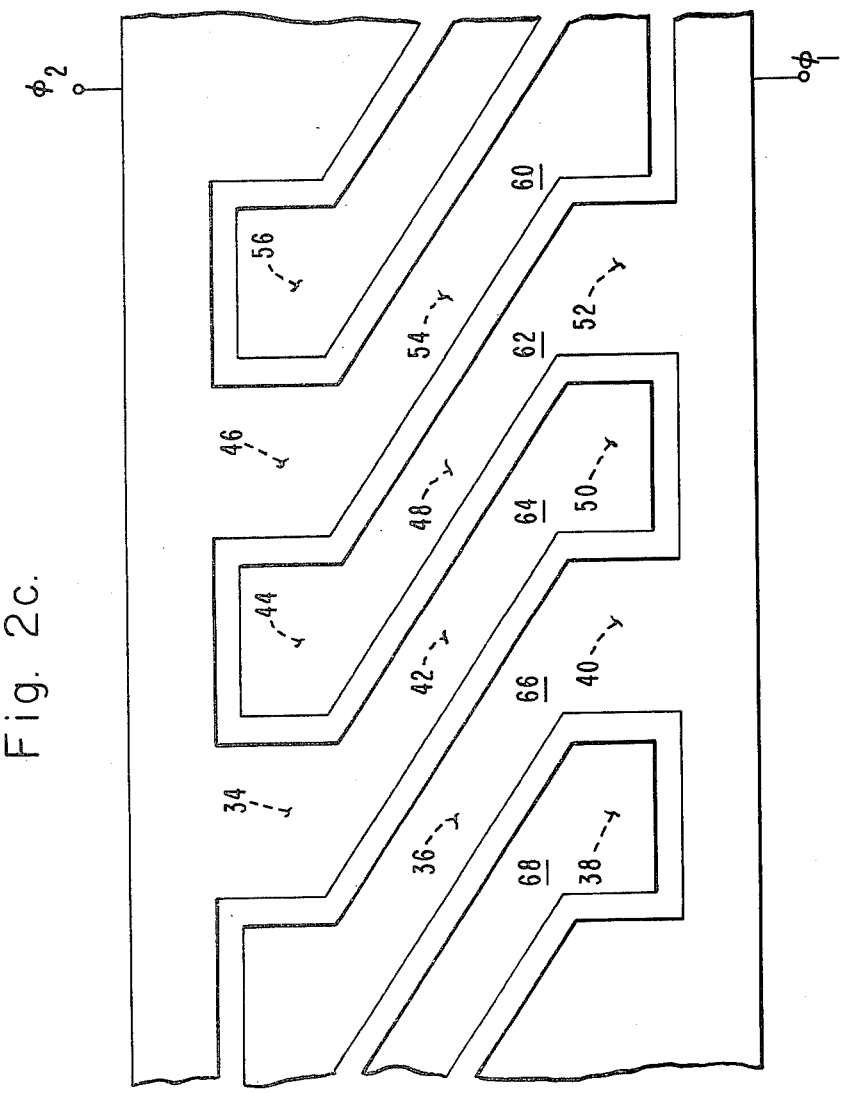

SERPENTINE CHARGE COUPLED DEVICE

TECHNICAL FIELD

This invention is related to charge coupled devices in which the linear density of charge packets in a serial register is increased by storing charge in a serpentine array.

BACKGROUND OF THE INVENTION

Charge coupled devices (CCD's) of the type disclosed in Sequin et al, *Charge Transfer Devices*, Academic Press, 1975 have a limited density of CCD charge packet storage cells or "buckets" within a given area. This has limited the performance of charge coupled image sensors such as those disclosed in the above-referenced Sequin publication at pages 142-200. Charge coupled image sensors using time delay and integration (TDI) are disclosed by Erb et al, "Buried Channel Charge Coupled Devices for Infrared Applications," CCD Aplications Conference, *Proceedings*, Sept. 18-20, 1973, San Diego, Calif. In such devices a field of view is scanned by a column of image detectors in synchronism with charge transfer in an adjacent output CCD serial register and the charge transfer in the CCD register occurs at the same rate that the adjacent detectors are scanned across the field of view. Accordingly, the sampling rate, or the number of samples taken within a given area of the field of view, is limited by the density of buckets in the CCD serial register. Although the number of samples may be increased by crowding the image detectors together and increasing the density of the charge coupled device bits, such miniaturization has the effect of limiting the charge capacity of each bucket of the charge coupled device register, thus limiting the dynamic range of the image sensor. Thus, in time delay and integration (TDI) charge coupled device (CCD) imagers, a trade-off exists between sampling rate and dynamic range. Accordingly, it has not seemed possible in the prior art to maximize dynamic range while at the same time maximizing the sampling rate.

It has been a general goal in the prior art to find ways to increase the linear density of charge coupled device cells or buckets without having to reduce the CCD geometry or dynamic range. One advance made in the prior art is the meander channel CCD which is useful for both charge coupled device image sensors and for charge coupled device signal processors. The meander channel CCD, instead of moving charge in a straight line, causes the charge to be transferred in meandering fashion along a serial register which has the appearance of two parallel linear serial registers. One such device particularly useful with TDI CCD imagers, is disclosed in U.S. Pat. No. 4,380,056 issue Apr. 12, 1983, filed Feb. 20, 1981 by William J. Parrish and Christopher L. Fletcher and entitled "Charge Coupled Device Focal Plane with Serial Register Having Interdigitated Electrodes," and assigned to the assignee of the present application, the disclosure of which is incorporated herein by reference.

The main advantage of meander channel CCD's is that their production yield is generally greater than that of the usual linear CCD's.

SUMMARY OF THE INVENTION

The trade-off between dynamic range and sampling rate in a charge coupled device is virtually eliminated in the present invention, a serpentine charge coupled device. In this invention, for each charge packet or "bit" transferred in a first direction, a plurality of n bits are transferred in a second transverse direction simultaneously. In one embodiment, the serpentine CCD is defined on a semiconductive substrate by two parallel channel stops extending in a first direction and defining the width of the serpentine CCD and a plurality of interlaced channel stop fingers extending parallel to one another in a second transverse direction, the interlaced channel stop fingers being connected alternately to the first two parallel channel stops. Charge transfer is accomplished under the control of a plurality of parallel electrodes extending in the first direction formed in a first level above the substrate and a second plurality of parallel electrodes formed in a second level above the substrate which extend in a third direction transverse to both the first and second directions and defining an acute angle therebetween. The number n of bits transferred in the second direction (for each bit transferred in the first direction) is determined by the number of the parallel electrodes extending in the first direction. The number n may be increased by simply increasing the number of the parallel electrodes overlying the substrate region between the two parallel channel stops, which number may be theoretically unlimited.

It is contemplated that the invention may be used with a TDI CCD focal plane array in which a plurality of detectors extends in the first direction along the length of the serpentine CCD and feeds output charge into the serpentine CCD. The advantage of this arrangement is that, as each bit of output charge from the array of detectors is transferred by one CCD cell or bucket along the first direction or length of the serpentine CCD, it is also transferred in the second transverse direction by n buckets. Accordingly, the rate of change transfer in the serpentine CCD should be n times the rate at which the TDI CCD array of detectors is optically scanned in the first direction. In this way, the rate of charge transfer in the first direction equals the rate of optical scan in the first direction while the CCD clock frequency or sampling rate is increased by n. Because n is theoretically limited only by the available area on the CCD substrate, the invention represents a significant advance over the prior art in the image quality obtainable with TDI CCD imagers. Another advantage of the invention is that the increased width of the serpentine CCD register facilitates a more efficient use of space on the semiconductor substrate.

Finally, because the increase in sampling rate in this invention is not necessarily accompanied by a corresponding decrease in CCD bucket capacity, the tradeoff between sampling rate and dynamic range is virtually eliminated.

DESCRIPTION OF THE DRAWINGS

The invention is best understood by reference to the accompanying drawings of which:

FIG. 2a is a diagram illustrating the preferred pattern of channel stops on the substrate of FIG. 1;

FIG. 2b illustrates the preferred pattern of first level electrodes formed over the substrate of FIG. 1 and corresponding to the channel stop pattern of FIG. 2a;

FIG. 2c illustrates the preferred pattern of second level electrodes formed over the substrate of FIG. 1 and corresponding to the patterns of FIGS. 2a and 2b;

FIG. 3b illustrates the direction of charge flow in the delay line of FIG. 3a;

FIG. 3c is a schematic diagram of the delay line of FIG. 3a; and

DETAILED DESCRIPTION OF THE INVENTION

Figure 1:
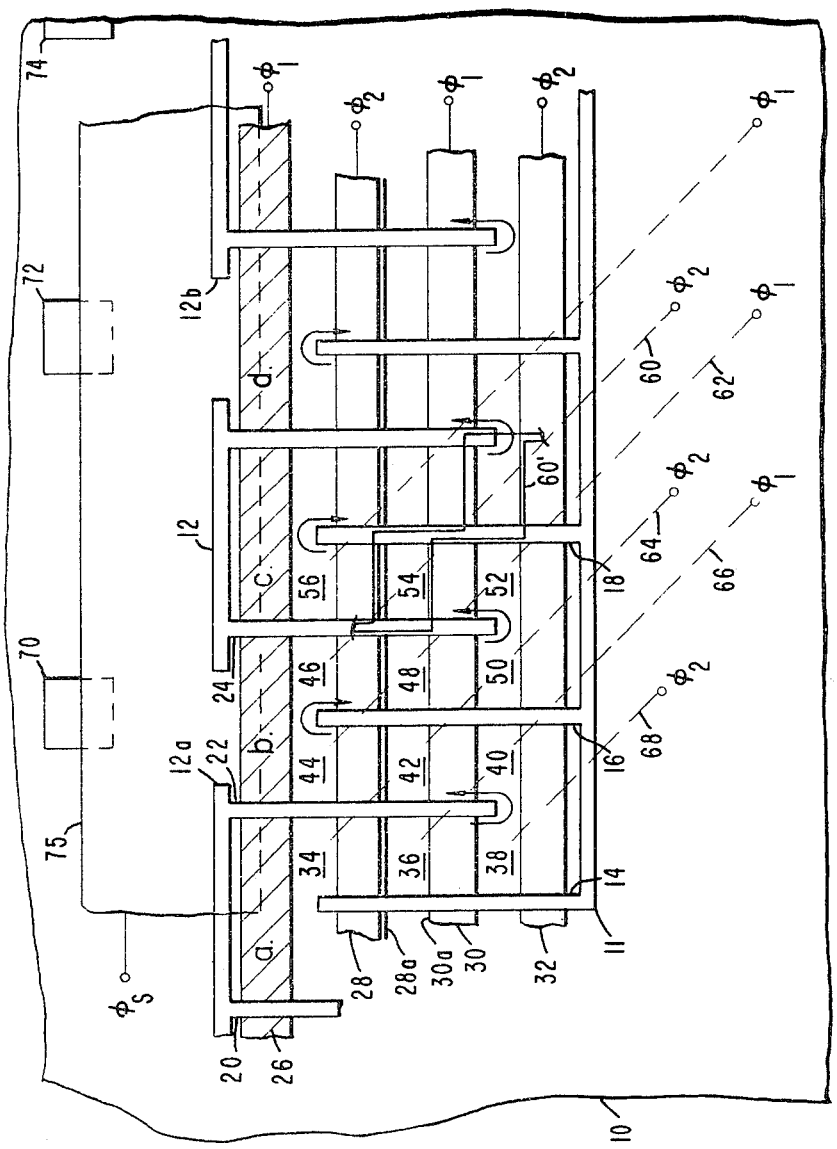
FIG. 1 is a simplified diagram illustrating in schematic form the top view of the serpentine charge coupled device register of the invention.

Referring to FIG. 1, a semiconductive substrate 10, such as silicon, is doped to be, for example, of n-type conductivity. Two parallel elongate channel stops 11, 12 extend in a first direction and, in the present example, are highly doped regions of n-type conductivity formed in the top surface of the substrate 10. A first plurality of n-type channel stop fingers 14, 16, 18 extend in a second direction transverse to the first direction from the first channel stop 11 and are interlaced with and parallel to a second plurality of parallel n-type channel stop fingers 20, 22, 24 extending from the second channel stop 12. A first plurality of parallel elongate insulated electrodes 26, 28, 30, 32 extend in the first direction parallel to the channel stops 11, 12. The electrodes 26-32 are all formed at a first level above the top surface of the substrate 10.

Charge transfer in the surface of the substrate 10 is effected in the serpentine path defined between the interlaced fingers 14-24 by means of a plurality of insulated electrode portions 34, 36, 38, 40, 42, 44, 46, 48, 50, 52, 54, 56 formed in a second level over the substrate 10. Preferably, the first level electrodes 26-32 are formed in a lower level insulated polycrystalline silicon layer while the electrode portions 34-56 are formed in an upper level insulated polycrystalline silicon layer in a manner well known to those skilled in the art.

Positive charge packets in the serpentine CCD of FIG. 1 are transferred sequentially beneath each of the electrode portions 34-56. Thus, a charge packet is first transferred beneath the electrode portion 34, secondly below the portion 36, then below the portion 38, etc., as indicated by the dashed-line arrows. For this purpose, alternate ones of the electrodes 26, 28, 30, 32 are connected to first and second complementary clock signals $\phi_1$, $\phi_2$ respectively, as indicated in FIG. 1. Furthermore, the electrode portions 34-56 are connected in alternate diagonal groups to the complementary clock signals $\phi_1$, $\phi_2$ by means of diagonally extending conductive portions 60, 62, 64, 66, 68, etc. The diagonal conductive portions 60-68 are each represented as a dashed line in FIG. 1 for simplicity. For example, the diagonal group of electrode portions 34, 42, 50 is connected together by the conductive portion 64, the conductive portion 64 being connected to receive the clock signal $\phi_2$. The conductive portion 64 is formed in the same upper level polysilicon layer that the electrode portions 34-56 are formed in. Similarly, the diagonal group of electrode portions 44, 48, 52 is connected by means of the conductive portion 62 to receive the complementary clock signal $\phi_1$. The plurality of electrode portions 34-56 overlie the gaps between adjacent ones of the plurality of elongate parallel electrodes 26-32. Each of the diagonally extending portions 60-68, in combination with its corresponding diagonal group of electrode portions 34-56, actually assumes the staircase form of the diagonally extending electrode 60' partially illustrated in FIG. 1 in solid line.

Charge transfer occurs as follows. During a first time interval in which the clock signal $\phi_1$ is at a relatively low potential and the complementary clock signal $\phi_2$ is at a relatively high potential, the substrate surface potential beneath the electrode 26 is decreased so that a positive charge packet may be stored in the surface potential well (or "bucket") so formed beneath the electrode 26 between the two adjacent channel stop fingers 20, 22. Thereafter, the complementary clock signals $\phi_1$, $\phi_2$ change state and the clock signal $\phi_2$ is low while the clock signal $\phi_1$ is high so that the positive charge packet is attracted to flow beneath the electrode portion 34 and into an adjacent potential well formed beneath the electrode 28. The charge packet is now confined in the region beneath the electrode 28 between the adjacent channel stop fingers 14 and 22. Again, the complementary clocks signals $\phi_1$, $\phi_2$ change state so that $\phi_1$ is now low. Accordingly, the positive charge packet is attracted from beneath the electrode 28 to flow under the electrode portion 36 to reside in a surface potential well formed beneath the electrode 30. The charge packet is still confined between the two channel stops 14, 22. Transfer of the positive charge packet continues beneath succeeding electrode portions 38, 40, 42, 44, etc., so that the charge packet follows the serpentine path indicated by the dashed-line arrows of FIG. 1.

The direction of charge transfer is firmly established by the electrode arrangement illustrated in FIG. 1. Successive pairs of adjacent upper and lower level electrodes are connected alternately to receive one of the complementary clock signals $\phi_1$, $\phi_2$. The formation of a surface potential well beneath a succeeding pair of one of the electrodes 26-32 and one of the electrode portions 34-56 is always accompanied by the formation of a surface potential barrier beneath a preceeding pair of one of the electrodes 26-32 and one of the electrode portions 34-56. For example, as described previously, when the charge packet confined beneath the electrode 28 between the channel stop fingers 14 and 22 is subsequently transferred beneath the electrode portion 36, the clock signal $\phi_1$ is low while the clock signal $\phi_2$ is high, thus establishing a surface potential barrier beneath the electrode portion 34 and electrode 28 in the surface of the substrate 10 while establishing an attractive surface potential well beneath the electrode portion 36 and the electrode 30.

A large number of charge packets may be transferred simultaneously beneath alternate ones of the electrode portions 34-56, without requiring a large number of electrical contacts. Specifically, as will be described below in this specification in connection with FIGS. 2a-2d, only four contacts are required to apply the complementary clock signals $\phi_1$, $\phi_2$ to the electrodes 26-32 and to the plurality of electrode portions 34-56. This feature is implemented by the diagonal connection portions 60-68 connecting each of the diagonal groups of electrode portions 34-56, each of the diagonal connection portions 60-68 requiring only one contact to connect it to receive one of the complementary clock signals $\phi_1$, $\phi_2$.

A principal advantage of the invention is that a given charge packet is transferred in the first direction parallel to the channel stops 11, 12 at a fraction (1/6 in the embodiment illustrated in FIG. 1) of the rate at which it is transferred in the second direction parallel to the channel stop fingers 14–22. Accordingly, the serpentine CCD of FIG. 1 operates at six times the clocking frequency of a prior art linear CCD serial register wherein charge is stepped only in the first direction.

This latter feature is especially useful when the device of FIG. 1 is substituted in place of the usual simple linear CCD serial register in a TDI CCD imager. Specifically, a TDI column of photodetectors 70, 72, 74, etc., may be disposed adjacent and parallel to the serpentine CCD of FIG. 1 on the substrate 10, each detector 70, 72, etc., being adjacent openings 12a, 12b in the channel stop 12. Charge transfer from each of the detectors 70, 72, through the openings 12a, 12b, respectively, is controlled by a transfer electrode 75 formed in the second electrode layer and overlying the openings 12a, 12b. The transfer electrode 75 is connected to receive a clock signal $\phi_s$ which is synchronous with the clock signals $\phi_1$, $\phi_2$. The TDI column of detectors 70–74 is optically scanned at the same rate that the charge is transferred in the serpentine CCD in the first direction parallel to the channel stop 12. The shaded areas correspond to buckets or CCD storage cells a, b, c, d which are formed simultaneously in the surface of the substrate 10 beneath the electrode 26 in a time interval during which the complementary clock signals $\phi_1$, $\phi_2$ are low and high, respectively. As described in the above-referenced Erb publication, time delay and integration is achieved by scanning the field of view down the column of detectors 70, 72, 74 at the same rate that charge is transferred from left to right between the buckets a, b, c, d. For example, the rate of charge transfer in the serpentine CCD of FIG. 1 must be such that the same charge packet stored in the bucket b when the detector 70 views a particular pixel in the field of view must be transferred to the bucket d by the time the next detector 72 views the same pixel. In the serpentine CCD of FIG. 1, the total number of CCD bits or buckets between the two input buckets b and d is six times the number which would be present in a simple linear CCD serial register. Therefore, the serpentine CCD must transfer charge at six times the velocity at which the TDI column of detectors 70–74 is scanned. Thus, an imager comprising the TDI column of detectors 70–74 and the serpentine CCD illustrated in FIG. 1 has six times the sampling rate of prior art CCD image sensors, a significant advantage.

It should be noted that the performance of a prior art CCD imager having only a simple linear CCD serial register is not improved by simply increasing the clock frequency of the CCD. This would require a similar increase in the rate of scan of the TDI column of detectors, which would result in no net change in the sampling rate or number of samples in a given field of view.

The number of electrodes 26–32 may be increased to any desired number by widening the serpentine CCD between the channel stops 11, 12 so that the sampling rate is proportionately increased to any desired number, which is theoretically unlimited. However, it is contemplated that various practical limitations (such as, for example, the area available on the CCD substrate) will be considered by a skilled worker in selecting the sampling rate.

Another advantage of the invention is that the increase in the number of parallel electrodes 26–32 does not require that the capacity (or area) of each of the CCD buckets a, b, c, d be decreased. This is because the area of each CCD bucket is conserved by simply increasing the distance between the channel stops 11, 12. Thus, the sampling rate of the CCD imager may be increased without decreasing the capacity of each CCD bucket and the dynamic range of the device, thus virtually eliminating the trade-off which had previously existed in the prior art between dynamic range and sampling rate.

Figure 2B:
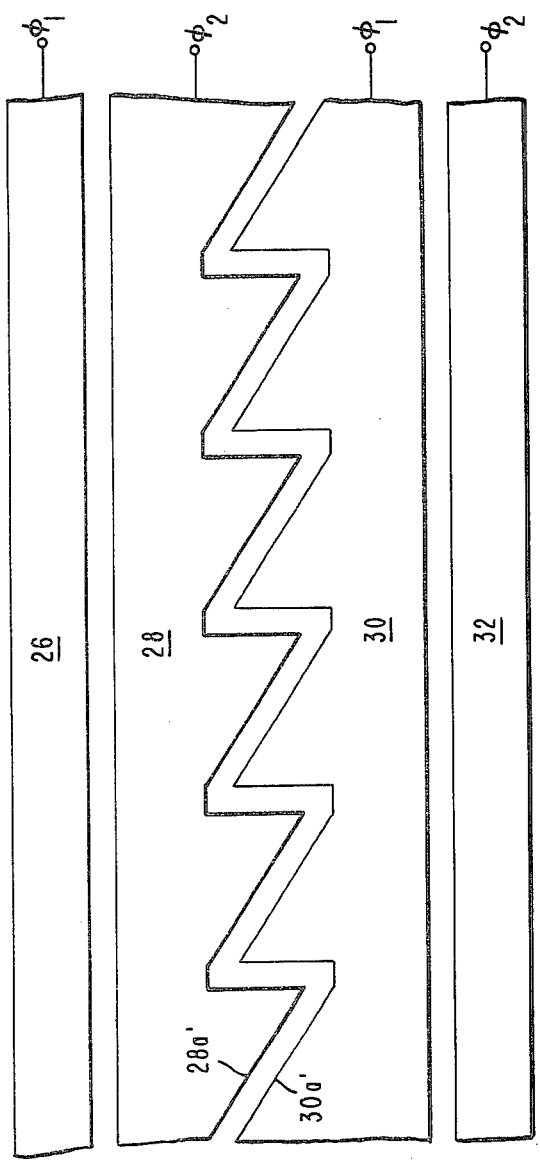
Figure 2D:
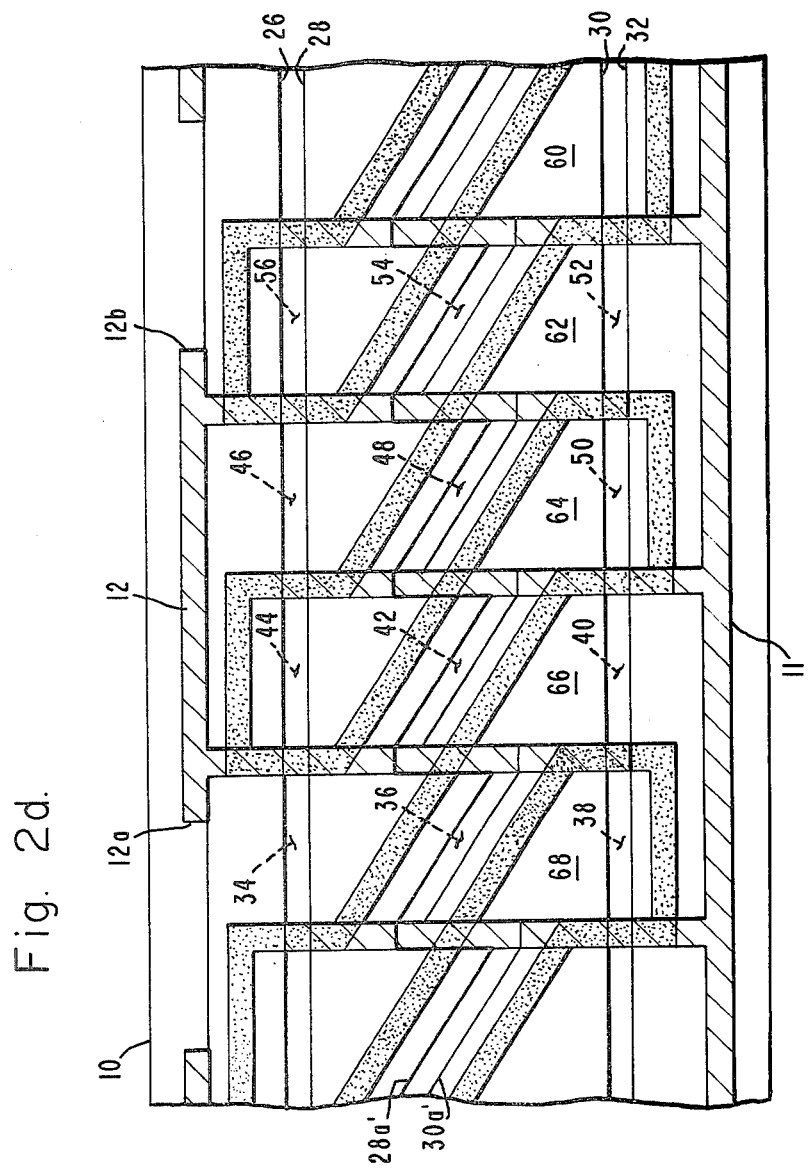
FIG. 2d illustrates the combined overlay of the patterns of FIGS. 2a, 2b and 2c.

FIG. 2a illustrates the preferred pattern of the channel stops 11, 12 and the interdigitated channel stop fingers 14–22. FIG. 2b illustrates the preferred pattern of the electrodes 26–32 formed in the lower level polysilicon layer. FIG. 2c illustrates the preferred pattern of the combination of electrode portions 34–56 and diagonal connecting portions 60–68 formed in the upper polysilicon layer. FIG. 2d illustrates the overlay of the preferred patterns of FIGS. 2a, 2b and 2c.

The preferred embodiment of FIGS. 2a, 2b, 2c and 2d is essentially the same as the embodiment of FIG. 1 in fundamental structure. FIG. 2c illustrates that the diagonal connecting portions 60–68 of the preferred embodiment include each of the electrode portions 34–52 of FIG. 1 overlying the various gaps between the first level electrodes 28–32, as previously described. In the example illustrated in FIG. 1, facing edges 28a, 30a of the first level electrodes 28, 30 extend along a straight line. In the preferred embodiment of FIGS. 2b and 2d, facing edges 28a', 30a' extend in the same diagonal direction between each pair of adjacent channel stop fingers 14–24 as do the diagonal connecting portions 60–68. However, the function of the preferred embodiment of FIGS. 2b, c and d is the same as the embodiment of FIG. 1 because all of the electrode portions 34–56 in the preferred embodiment of FIGS. 2c and 2d overlie gaps between various ones of the first level electrodes 28–32, just as they do in the embodiment of FIG. 1.

The advantage of the diagonal or serpentine path of the facing electrodes edges 28a', 30a' in the preferred embodiment of FIGS. 2b, c and d is that this configuration maximizes the area of the diagonal connecting electrode portions 60–68. As previously described, the diagonal connecting portions 60–68 can each assume the staircase configuration of the electrode 60' suggested in solid line in FIG. 1, in which case the facing electrode edges 28a, 30a are simply straight lines as illustrated in FIG. 1. However, as illustrated in FIG. 2a, the small linking portions 60" of the staircase electrode 60' of FIG. 1 must overlie and not extend beyond the underlying ones of the channel stop fingers 14–26, so that they must be quite thin. This can reduce the production yield of such devices. In contrast, the diagonal serpentine electrodes of FIGS. 2b, 2c and 2d have no such thin portions and therefore are the preferred embodiment of the invention simply because their production yield is not so impaired. Thus, in general, the facing edges of lower level electrodes underlying a diagonal electrode portion must themselves be diagonal. However, the facing edges of the lower level electrode pairs 30, 32 and 26, 28 are not diagonal. Accordingly, the diagonal electrode portions 60–68, as they extend over the latter facing electrode edges, become non-diagonal, or straight, and are terminated thereover.

The serpentine CCD of FIG. 1 may be operated in an alternative mode as a 4-phase charge coupled device using a plurality of 4-phase clock signals $\phi_a$, $\phi_b$, $\phi_c$, $\phi_d$. In this mode, alternate ones of the parallel electrodes 26–32 are connected to the clock signals $\phi_a$, $\phi_b$ while alternate ones of the diagonal connecting portions 60–68 are connected to the clock signals $\phi_c$, $\phi_d$.

It is contemplated that the serpentine CCD of FIG. 1 may be used in devices other than CCD imagers. For example, the serpentine CCD may be used as a means for performing series and parallel charge transfer in a CCD multiplexer. Alternatively, the serpentine CCD of FIG. 1 may be used in combination with a linear or meander channel CCD serial register as a delay line in a CCD signal processor. The meander channel CCD may be of the type disclosed in the above-referenced Parrish and Fletcher patent.

Figure 3A:
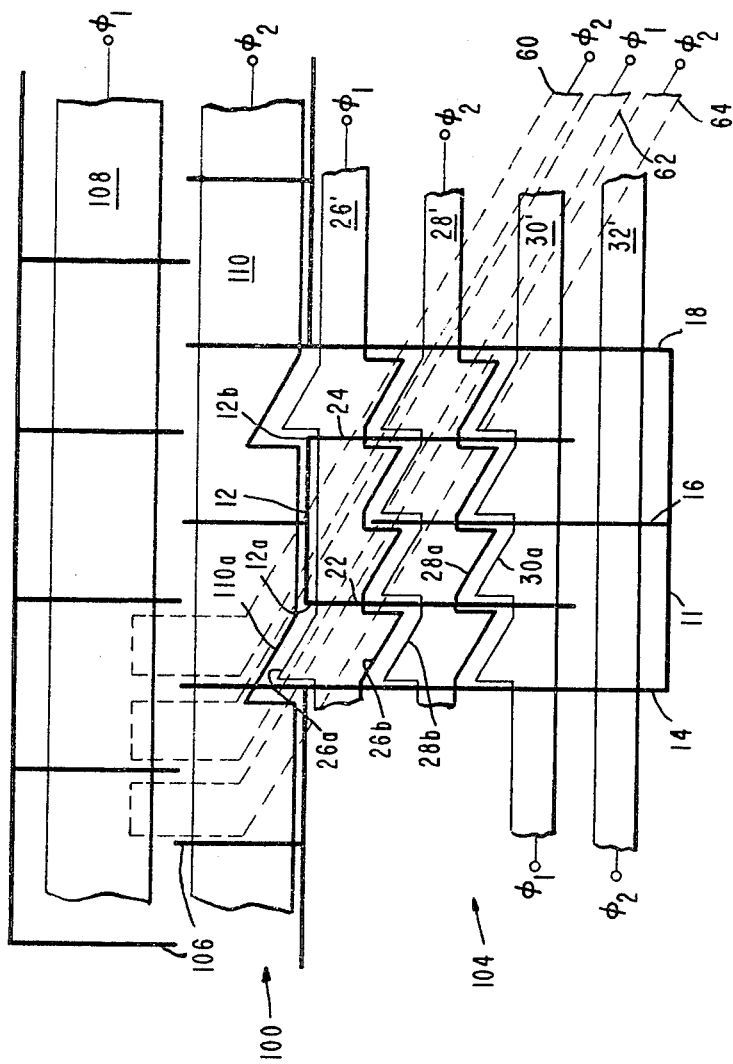
FIG. 3a illustrates a CCD delay line comprising the serpentine CCD of this invention combined with a meander channel CCD.
Figure 3B:
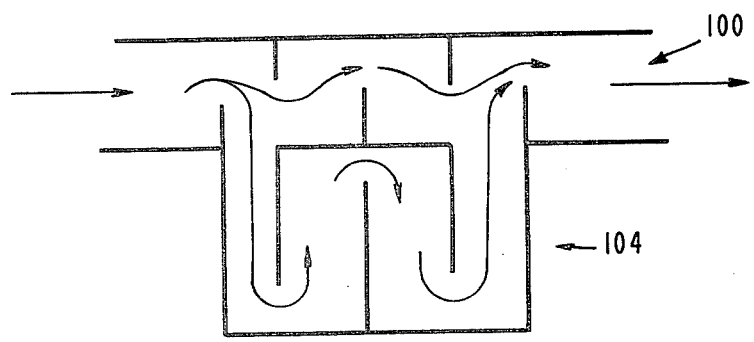

One possible embodiment of the delay line is illustrated in the simplified diagrams of FIGS. 3a and 3b, including a meander channel charge coupled device 100 formed on a semiconductive substrate 102 and a serpentine CCD 104 also formed on the substrate 102 in accordance with the present invention. The meander channel CCD 100 includes a plurality of interlaced channel stop fingers 106 formed in the substrate 102 and a pair of elongate electrodes 108, 110 overlying the substrate 102 and connected to receive the complementary clock signals $\phi_1$, $\phi_2$, respectively. The serpentine CCD 104 includes elements corresponding to those illustrated in FIGS. 2a, b, c, d, including the channel stops 11, 12, the interlaced channel stop fingers 14–24, parallel electrodes 26'–32' (with some differences discussed below) and the diagonal electrode portions 60–68.

Openings 12a and 12b in the channel stop 12 permit the transfer of charge between the meander channel CCD 100 and the serpentine CCD 104 in the manner illustrated in FIG. 3a. Charge transfer from the meander channel CCD 100 into the serpentine CCD 104 occurs through the opening 12a under the control of the diagonal electrode portion 62. For this purpose, the diagonal electrode portions 60–68 extend over and beyond the parallel electrodes 28'–32' so as to overlie the gap between the meander channel electrode 110 and the parallel electrode 26' at the entrance 12a and the exit 12b. As described previously in connection with FIG. 2b, all of the facing electrode edges underlying the diagonal electrode portions 60–68 must themselves be diagonal. Accordingly, FIG. 3a shows that (in contrast with the embodiment of FIG. 2b) electrode edges 26a, 26b, 28a, 28b, 30a and 110a are all diagonal.

The diagonal electrode portions 60–68 extend even further in FIG. 3a so as to overlie the gap between the CCD meander channel electrodes 108 and 110. This feature permits the diagonal electrode portions 60–68 to also control charge transfer in the meander channel CCD 100 in the manner of the interdigitated electrode fingers described in the above-referenced Parrish and Fletcher patent.

Figure 3C:
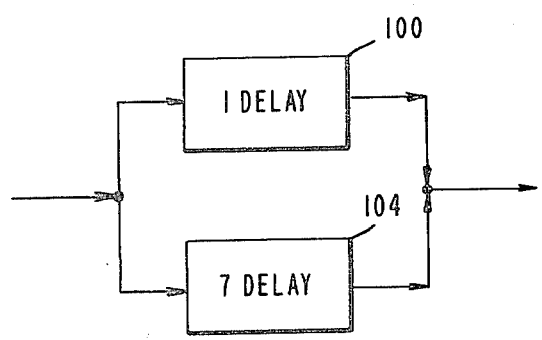

The charge admitted through the opening 12a is automatically returned through the opening 12b after a number of delays determined by the number of parallel electrodes 26'–32' in the serpentine CCD 104. As previously discussed, the number of charge transfers occurring in the transverse direction of the serpentine CCD illustrated is six times the number of charge transfers occurring in the primary direction of the serpentine CCD. Accordingly, if the charge transfer between the openings 12a and 12b through the meander channel CCD 100 is considered to be one signal delay, then the charge transferred through the alternative path provided by the serpentine CCD 104 must go through seven delays, as indicated schematically in FIG. 3c. This may be confirmed by simply comparing the number of buckets between the openings 12a and 12b in the meander channel CCD 100 and the serpentine CCD 104. Alternatively, the serial register 100 may be a simple linear CCD serial register instead of a meander channel CCD.

Figure 4:
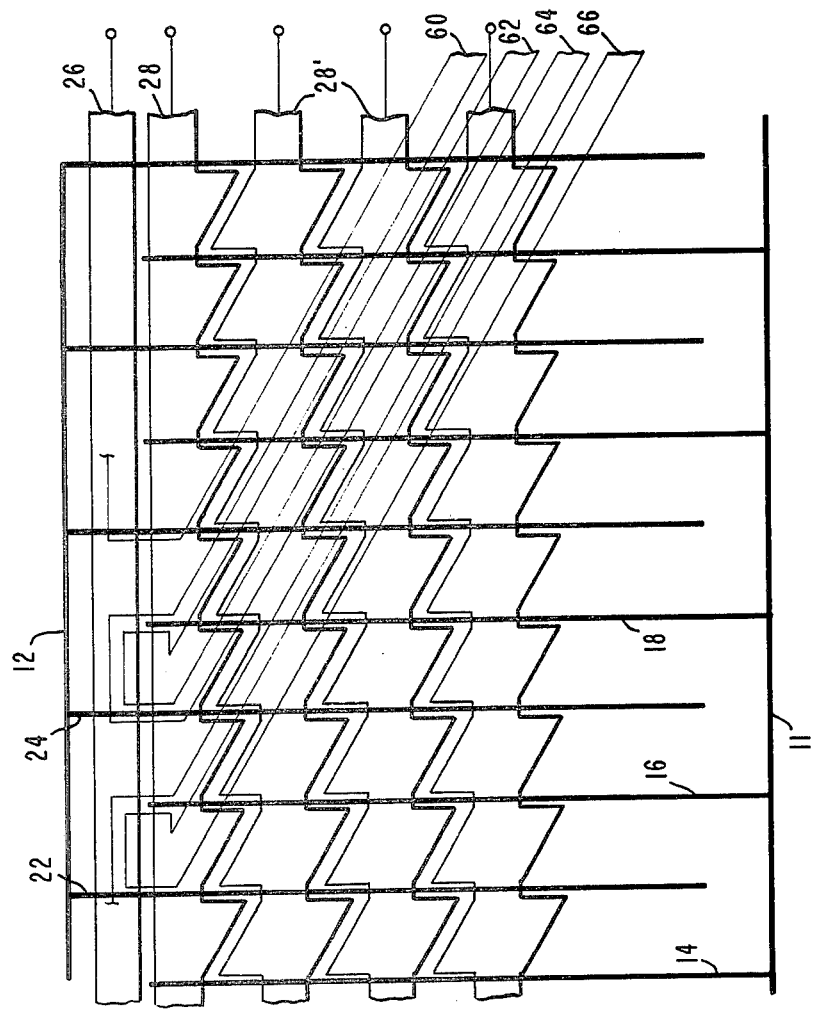
FIG. 4 is a schematic diagram of an alternative embodiment of the invention.

As suggested previously, the number of parallel electrodes 28–32 in the serpentine CCD 104 of FIG. 3a may be increased to any desired number, the general result being illustrated on FIG. 4. In FIG. 4, the patterns of the channel stops 11, 12 and channel stop fingers 14, 16 and 22, 24 are the same as that illustrated in FIG. 2d except that the fingers are longer in FIG. 4. The pattern of the diagonal electrodes 66–66 in FIG. 4 is also the same as in FIG. 2d except that they are longer. Finally the pattern of the parallel electrodes 26, 28 in FIG. 4 is the same as in FIG. 2d. However, a plurality of sawtooth edge parallel electrodes 28' of the type illustrated in FIG. 3a are present in FIG. 4, this being a chief distinction of the embodiment of FIG. 4.

Other variations of the serpentine CCD of this invention may be made by a skilled worker without departing from its spirit and scope.

What is claimed is:

1. A charge transfer device serial register, comprising:
    a semiconductive substrate;
    a plurality of interlaced channel stop fingers extending in a first direction in said substrate;
    a pluraliity of spaced-apart first electrodes extending in a second direction transverse to said first direction and overlying said fingers; and a
    plurality of second electrodes extending in a third direction transverse to both said first and second directions and overlying the gaps between adjacent ones of said first electrodes, wherein said first electrodes are formed in a first insulated layer over said substrate and said second electrodes are formed in a second insulated layer.

2. The serial register of claim 1 further comprising means for connecting alternate ones of said first and second electrodes to receive alternate complementary clock signals.

3. The serial register of claim 1 further comprising a pair of parallel channel stops extending in said second direction, each of said channel stops being connected to alternate ones of said channel stop fingers, wherein said plurality of first electrodes overlies a substrate region bounded by said two parallel channel stops.

4. The serial register of claim 1 wherein said first and second directions are perpendicular to one another and said third direction is diagonal with respect to said first and second directions.

5. A charge transfer device serial register, comprising:
    a semiconductive substrate;
    a plurality of interlaced channel stop fingers extending in a first direction in said substrate;
    a first plurality of insulated electrodes overlying said fingers and formed in a first level over said substrate and extending in a second direction;
    a plurality of electrode portions formed in a second level over said substrate, said electrode portions each overlying a corresponding region of said substrate located between adjacent ones of said channel stop fingers and in registration with adjacent ones of said first plurality of electrodes; and a plurality of conductive means extending in a third direction which is different from said first and second directions for connecting adjacent ones of said electrode portions grouped in a line extending along said third direction.

6. The serial register of claim 5 wherein each of said conductive means and said grouped electrode portions comprise a diagonally extending electrode formed in a second level above said plurality of first electrodes.

7. The serial register of claim 6 further comprising means for connecting alternate ones of said diagonal electrodes and alternate ones of said first electrodes to receive a first clock signal and for connecting the remaining ones of said diagonal electrodes and first electrodes to receive a complementary clock signal.

8. An improved time delay and integration charge coupled device imager, comprising:
   a semiconductive substrate;
   a pair of channel stops in said substrate extending in one direction defining a charge flow channel therebetween;
   a row of photodetector diodes formed in said substrate adjacent said channel and adjacent one of said channel stops;
   first and second pluralities of interlaced channel stop fingers, said first plurality of channel stop fingers connected to one of said channel stops and partially extending in an other direction toward the other of said channel stops, said second plurality of channel stop fingers being connected to said other channel stop and partially extending in said other direction toward said one channel stop;
   a first plurality of electrodes extending in said one direction and overlying said channel;
   a second plurality of electrodes extending in a diagonal direction transverse to both said one and other directions and overlying said channel, wherein said first electrodes are formed in a first insulated layer and said second electrodes are formed in a second insulated layer over said substrate;
   a plurality of openings in said one channel stop, each of said openings being between a respective pair of adjacent ones of said first plurality of channel stop fingers and facing a corresponding one of said photodetector diodes; and
   means for applying complementary clock signals to said first and second pluralities of electrodes.

9. The imager of claim 8 wherein said photodetector row is optically scanned at a particular rate and said clock signal means implements charge transfer in said channel in said one direction at a first rate corresponding to said scanning rate and in said other direction at a second rate greater than said first rate by a factor proportional to the number of said first plurality of electrodes.

10. The imager of claim 9 further comprising a transfer electrode overlying said substrate and comprising means for controlling the transfer of charge from said plurality of photosensitive diodes through said plurality of channel stop openings, and wherein said clock signal means applies a clock signal to said transfer electrode in synchronism with said complementary clock signals.

11. A charge coupled device transversal filter, comprising:
   a semiconductive substrate;
   a pair of channel stops formed in said substrate and extending in one direction to form a charge-carrying channel;
   first and second pluralities of interlaced channel stop fingers, said first plurality of channel stop fingers being connected to one of said channel stops and partially extending in an other direction toward the other said channel stops, said second plurality of channel stop fingers being connected to the other of said channel stops and partially extending toward said one channel stop in said other direction;
   a first plurality of electrodes extending in said one direction and overlying said channel;
   a second plurality of electrodes extending in a diagonal direction transverse to said one and other directions and overlying said channel, wherein said first plurality of electrodes are formed in a first insulated layer and said second plurality of electrodes are formed in a second insulated layer over said substrate;
   a pair of openings formed in said one channel stop, one of said openings comprising a charge flow entrance and the other of said openings comprising a charge flow exit;
   a charge coupled device register adjacent said channel and adjacent said one channel stop having an input and an output, said output being adjacent said entrance and said input being adjacent said exit; and
   means for applying clock signals to said first and second pluralities of electrodes whereby charge transfer in said channel is synchronized with charge transfer in said register.

12. The transversal filter of claim 11 wherein said register comprises a charge coupled device meander channel register and wherein said channel comprises a delay line having a delay proportional to the number of said first plurality of electrodes.

* * * * *